(12) United States Patent
Burke et al.

(10) Patent No.: US 10,881,027 B2
(45) Date of Patent: Dec. 29, 2020

(54) SOCKETS FOR REMOVABLE DATA STORAGE DEVICES

(71) Applicant: Western Digital Technologies, Inc., San Jose, CA (US)

(72) Inventors: John Burke, San Jose, CA (US); Michael Lavrentiev, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/450,947

(22) Filed: Jun. 24, 2019

(65) Prior Publication Data

US 2020/0128691 A1 Apr. 23, 2020

Related U.S. Application Data

(60) Provisional application No. 62/748,489, filed on Oct. 21, 2018.

(51) Int. Cl.
*H05K 7/20* (2006.01)
*F28F 13/00* (2006.01)
*H05K 5/02* (2006.01)

(52) U.S. Cl.
CPC ............ *H05K 7/2049* (2013.01); *F28F 13/00* (2013.01); *H05K 5/0286* (2013.01); *F28F 2013/008* (2013.01); *F28F 2255/04* (2013.01)

(58) Field of Classification Search
CPC ..... H05K 7/2049; H05K 5/0286; F28F 13/00; F28F 2255/04; F28F 2013/008; F28F 2013/006; G06F 1/20; G06F 1/183; F28D 2021/0029; H01R 13/502; H01R 13/639; H01R 13/64; H01R 12/714

USPC ........................................................ 361/707
See application file for complete search history.

(56) References Cited

U.S. PATENT DOCUMENTS

| | | | | |
|---|---|---|---|---|
| 5,818,182 A | * | 10/1998 | Viswanadham | G06K 7/0047 318/116 |
| 7,872,873 B2 | * | 1/2011 | Hiew | G06F 1/1632 361/737 |
| 8,462,514 B2 | * | 6/2013 | Myers | G06K 13/0831 361/754 |
| 2002/0131245 A1 | * | 9/2002 | Clayton | H01L 23/32 361/736 |

(Continued)

FOREIGN PATENT DOCUMENTS

| | | |
|---|---|---|
| CN | 202076551 U | 12/2011 |
| CN | 105281068 A | 1/2016 |

(Continued)

*Primary Examiner* — Stephen S Sul
(74) *Attorney, Agent, or Firm* — Barry IP Law, P.C.

(57) ABSTRACT

A socket includes a housing configured to receive a removable Data Storage Device (DSD) and a Thermal Interface Material (TIM). An assembly of the socket is attached to the housing and configured to expand due to heat. In a thermally expanded state, the assembly causes the TIM to come into contact with the removable DSD to draw heat away from the removable DSD. According to another aspect, a retaining strip or assembly is attached to a housing in a configuration such that the retaining strip or assembly expands due to heat to increase a resistance to removal of the removable DSD from the housing when the retaining strip or assembly is in a thermally expanded state.

22 Claims, 5 Drawing Sheets

(56) References Cited

U.S. PATENT DOCUMENTS

| | | | |
|---|---|---|---|
| 2008/0218799 A1 | 9/2008 | Hiew et al. | |
| 2010/0321912 A1* | 12/2010 | Chen | H05K 3/361 |
| | | | 361/783 |
| 2015/0075752 A1* | 3/2015 | Taheny | H01L 23/433 |
| | | | 165/104.21 |
| 2015/0264842 A1* | 9/2015 | Song | H05K 7/20445 |
| | | | 361/714 |
| 2016/0073529 A1* | 3/2016 | Kole | H04B 1/3816 |
| | | | 74/100.1 |
| 2016/0380385 A1* | 12/2016 | Heiskanen | H01R 13/6335 |
| | | | 439/160 |
| 2020/0006934 A1* | 1/2020 | Malacara-Carrillo | |
| | | | H01H 71/10 |

FOREIGN PATENT DOCUMENTS

| | | |
|---|---|---|
| CN | 107660101 A | 2/2018 |
| JP | 2003331975 A | 11/2003 |
| KR | 20080042963 A | 5/2008 |

\* cited by examiner

SOCKETS FOR REMOVABLE DATA STORAGE DEVICES

CROSS-REFERENCE TO RELATED APPLICATION

This application claims the benefit of U.S. Provisional Application No. 62/748,489, entitled "METHOD AND APPARATUS FOR REMOVING THERMAL ENERGY AND PREVENTING REMOVAL DURING USE OF A REMOVABLE DATA STORAGE DEVICE", filed on Oct. 21, 2018, which is hereby incorporated by reference in its entirety.

BACKGROUND

The power required for operating removable Data Storage Devices (DSDs) is generally increasing. Such removable DSDs can include, for example, Secured Digital (SD) cards, that can be inserted and removed from electronic devices, such as a desktop, laptop or notebook computer or another type of electronic device such as a tablet, smartphone, network media player, portable media player, television, or digital camera. The increased power usage can increase the temperature of the DSD and can make it difficult to maintain a safe or specified operating temperature for preventing damage to a controller or a non-volatile memory in the DSD (e.g., NAND flash memory) or for preventing data loss.

In addition, the increased temperature due to greater power usage may cause discomfort for a user who removes the DSD too soon while the DSD is still hot. Removal of the DSD too soon can also cause errors, such as when the DSD is removed while data is being read or written in the DSD or before a command completion status has been returned to the controller of the DSD or to a host communicating with the DSD.

BRIEF DESCRIPTION OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

DETAILED DESCRIPTION

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

Example Socket Arrangements

Figure 1A:
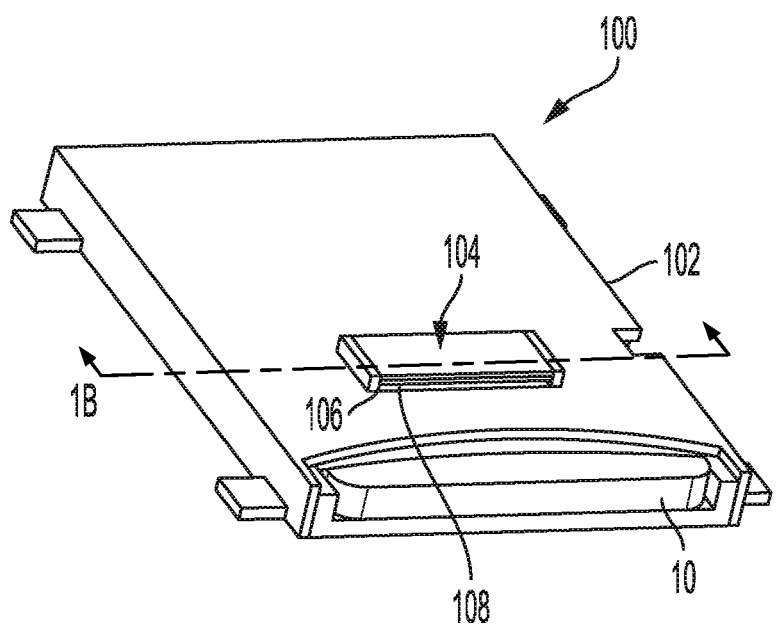
FIG. 1A is a perspective view of a socket for a removable Data Storage Device (DSD) according to an embodiment.

FIG. 1A is a perspective view of socket 100 for receiving removable Data Storage Device (DSD) 10. Removable DSD 10 can include, for example, a Secured Digital (SD) card, Universal Serial Bus (USB) flash drive, Subscriber Identification Module (SIM) card, CompactFlash (CF) card, memory stick, or zip drive, that can be inserted and removed from electronic devices, such as a desktop, laptop, notebook computer, tablet, smartphone, network media player, portable media player, television, or digital camera. In this regard, socket 100 can be part of such an electronic device or may be a standalone device (e.g., a memory card reader).

As discussed above, the power required for operating removable DSDs, such as removable DSD 10, is generally increasing, which increases the temperature of the DSD and can make it difficult to maintain a safe or specified operating temperature for preventing damage to a controller or a non-volatile memory in the DSD (e.g., NAND flash memory) and preventing data loss. In addition, the increased temperature may cause discomfort for a user who removes the DSD while it is still hot. In this regard, removing the DSD too soon can also cause errors.

The sockets disclosed herein include an assembly or retaining strip that helps remove heat from removable DSDs and/or increases a resistance to removing the DSD from the socket when the assembly or retaining strip is in a thermally expanded state. This ordinarily allows for increased power to be used by the DSD while maintaining a lower or safer operating temperature. In addition, the resistance to removal can reduce the likelihood of a user touching too much of the DSD when it is hot and reduce errors by ordinarily preventing premature removal of the DSD.

Socket 100 in the example of FIGS. 1A to 1D includes housing 102 configured to receive a removable DSD, such as DSD 10. Housing 102 may be sized or configured to receive one or more form factors for a removable DSD, such as, for example, an SD card, microSD card, and/or nanoSD card. In addition, housing 102 may also be sized or configured to receive one or more different types of removable DSDs, such as, for example, an SD card, USB flash drive, SIM card, CF card, memory stick, and/or zip drive. In this regard, housing 102 may include different grooves or tracks for receiving different types of removable DSDs or different form factors.

In some implementations, housing 102 can be formed of one or more plastic materials, such as a PolyCarbonate (PC) material, an Acylonitrile Butadiene Styrene (ABS) material, a Polyphenylene Ether (PPE) material, a Polystyrene (PS) material, or a Polybutylene Terephthalate (PBT) material. In other implementations, housing 102 can be formed of a metal material, such as steel or aluminum. As those of ordinary skill in the art will appreciate, the selection of a material for housing 102 can depend upon design considerations such as the strength, stiffness, electrical resistance, and/or ability to color the material.

Figure 1B:
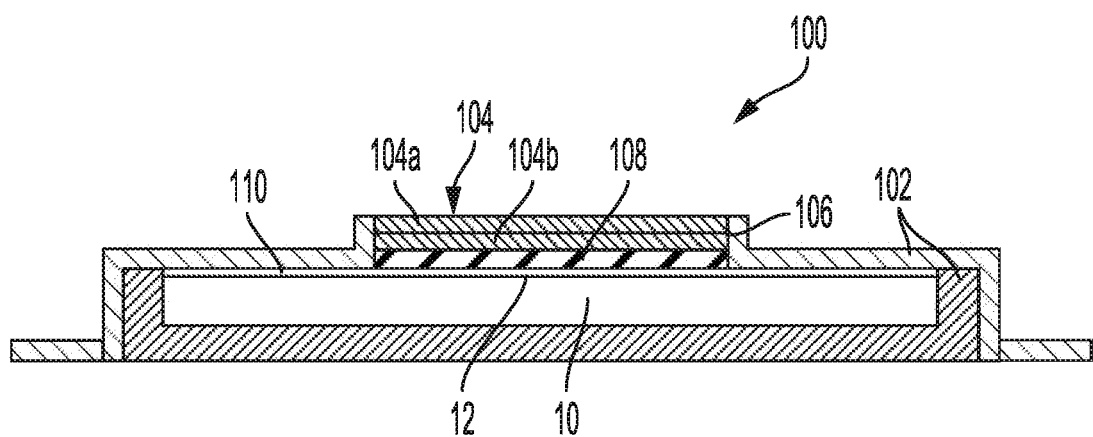
FIG. 1B is a cross section view of the socket of FIG. 1A according to an embodiment.
Figure 1C:
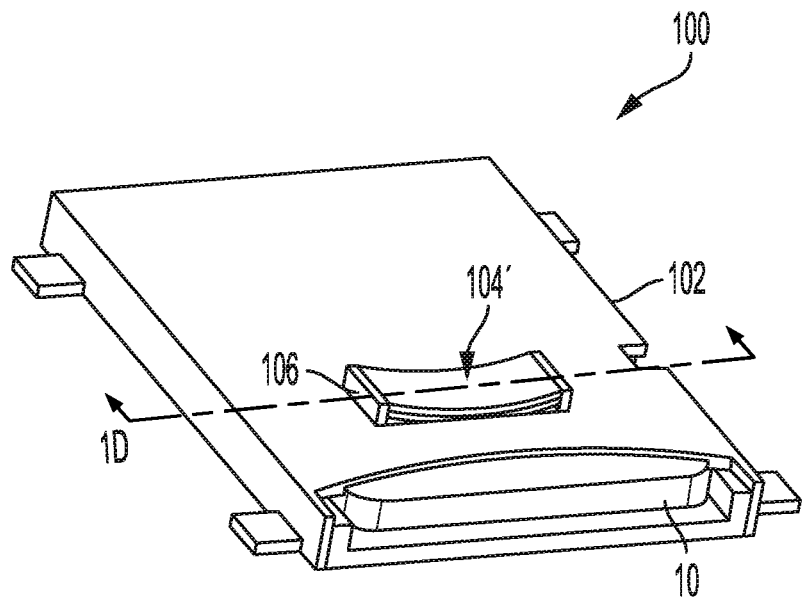
FIG. 1C is a perspective view of the socket of FIG. 1A depicting an assembly of the socket in a thermally expanded state according to an embodiment.
Figure 1D:
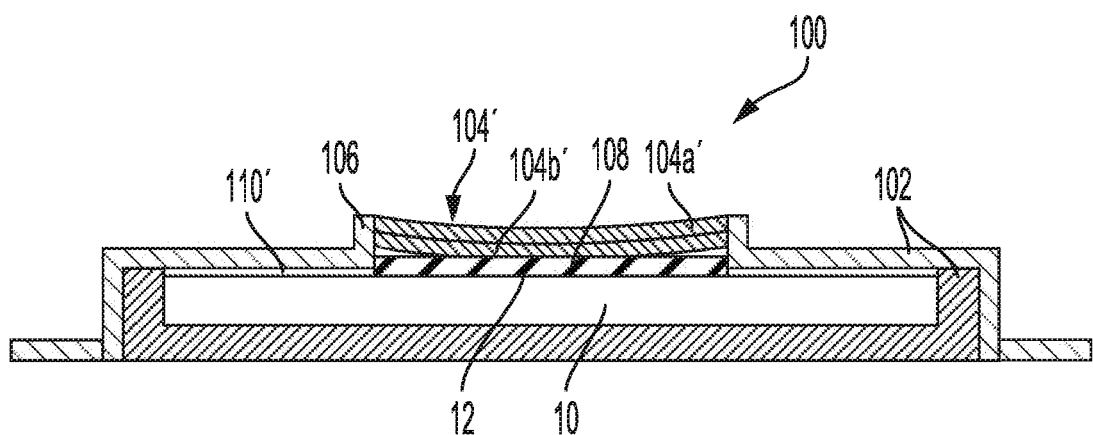
FIG. 1D is a cross section view of the socket of FIG. 1C depicting the assembly in the thermally expanded state according to an embodiment.

FIG. 1B is a cross section view of socket 100 along cross section line 1B in FIG. 1A, and FIG. 1D is a cross section view of socket 100 along cross section line 1D in FIG. 1C. As best shown in FIGS. 1B and 1D, housing 102 is comprised of two components including a top portion and a bottom portion. The components of housing 102 can include different materials affixed to each other. In other implementations, housing 102 can be formed of more components or may be integrally formed as a single component, as in the example of housing 302 in FIG. 3.

As shown in FIGS. 1A and 1B, housing 102 includes slot portion 106 through which assembly 104 is attached to socket 100, and which can allow Thermal Interface Material (TIM) 108 to move toward DSD 10 into gap 110 when assembly 104 is in a thermally expanded state, as shown in FIGS. 1C and 1D. In FIGS. 1A and 1B, assembly 104 is at a temperature, such as room temperature, that does not cause sufficient thermal expansion of assembly 104 further into slot portion 106. In such a thermally unexpanded state, TIM 108 does not contact DSD 10 and does not interfere with the insertion or removal of DSD 10. Assembly 104 can be inserted into slot portion 106 or otherwise attached to opposing walls of slot portion 106 so that when assembly 104 thermally expands, the thermal expansion occurs in a direction toward DSD 10, as shown in FIGS. 1C and 1D.

In the example of FIGS. 1A to 1D, assembly 104 can include a bi-metal material composition with first layer 104*a* and second layer 104*b*. First layer 104*a* can have a greater coefficient of thermal expansion than second layer 104*b* so that assembly 104 curves or bends downward toward DSD 10 through slot portion 106. Examples of metals that can be used in the bi-metal configuration include brass and iron, brass and steel (e.g., stainless steel), or steel and copper. While a bi-metal assembly is described above, those of ordinary skill in the art will appreciate that other materials with a similar thermal expansion property can be used as substitutes in other implementations. For example, materials that have a sufficient difference in coefficients of thermal expansion can be layered to provide a desired change in shape of the assembly when heated.

FIG. 1C is a perspective view of the socket 100 when assembly 104 of FIGS. 1A and 1B is in a thermally expanded state, which is indicated in FIG. 1C as assembly 104' with first layer 104*a*' and second layer 104*b*'. The thermal expansion of assembly 104 can be due to heat generated from operation of DSD 10 and/or from other sources near socket 100, such as a host processor near socket 100. In some implementations, temperatures of 100° F. to 120° F. can cause thermal expansion of assembly 104 toward the curved or bent shape shown in FIGS. 1C and 1D.

The curving or bending of assembly 104 causes at least a portion of assembly 104 to push onto TIM 108. In addition to removing or drawing heat from DSD 10, TIM 108 increases a frictional resistance to removal of DSD 10 when TIM 108 comes into contact with DSD 10. As discussed above, this increased resistance to removal can serve as a precautionary measure against premature removal of DSD 10 when assembly 104 is in the thermally expanded state. In this regard, assembly 104 may be viewed as a retaining strip that increases the resistance to removal of DSD 10 via TIM 108.

As shown in FIG. 1D, TIM 108 has been pushed into contact with DSD 10 through at least a portion of slot portion 106 and gap 110 between DSD 10 and housing 102, which has been reduced in space as shown by gap 110' in FIG. 1D. For its part, TIM 108 includes a material that increases the thermal conductivity between DSD 10 on the one hand, and assembly 104 and/or slot portion 106 of housing 102 on the other hand. In this regard, TIM 108 and/or housing 102 can serve as heat sinks. As will be appreciated by those of ordinary skill in the art, TIM 108 can include, for example, a thermally conductive pad including silicone, acrylic, or a metal TIM, such as aluminum nitride. The choice of material for TIM 108 can also consider a coefficient of friction between the TIM and DSD 10 so that a material providing a higher coefficient of friction (e.g., a sticky silicone material) is used for TIM 108 to increase a resistance to removing DSD 10 during operation.

Slot portion 106 of housing 102 may include a thermally conductive material, such as graphite, copper, or aluminum. As shown in FIG. 1D, slot portion 106 increases an air surface thermal interface for cooling housing 102. In some implementations, the opposing walls of slot portion 106 may extend farther from TIM 108 to serve as fins for channeling air blown over slot portion 106 to remove heat from housing 102.

In some implementations, the location of TIM 108, slot portion 106, and assembly 104 relative to housing 102 when DSD 10 is fully received in housing 102 corresponds to at least one of a portion of DSD 10 with a higher thermal conductivity than other portions of DSD 10 and/or a portion of DSD 10 that generates more heat during operation than other portions of DSD 10. For example, portion 12 of DSD 10 can correspond to an area close to the location of a controller in DSD 10 that generates more heat than other portions of DSD 10. As another example, portion 12 of DSD 10 can correspond to an area that may have a relatively higher thermal conductivity, such as a graphite, graphene, copper, or aluminum plate or surface.

Those of ordinary skill in the art will appreciate that other arrangements of socket 100 are possible. For example, other implementations may include multiple assemblies that thermally expand to push respective TIMs into contact with DSD 10 or other arrangements to cause contact between a TIM and a removable DSD.

Figure 2:
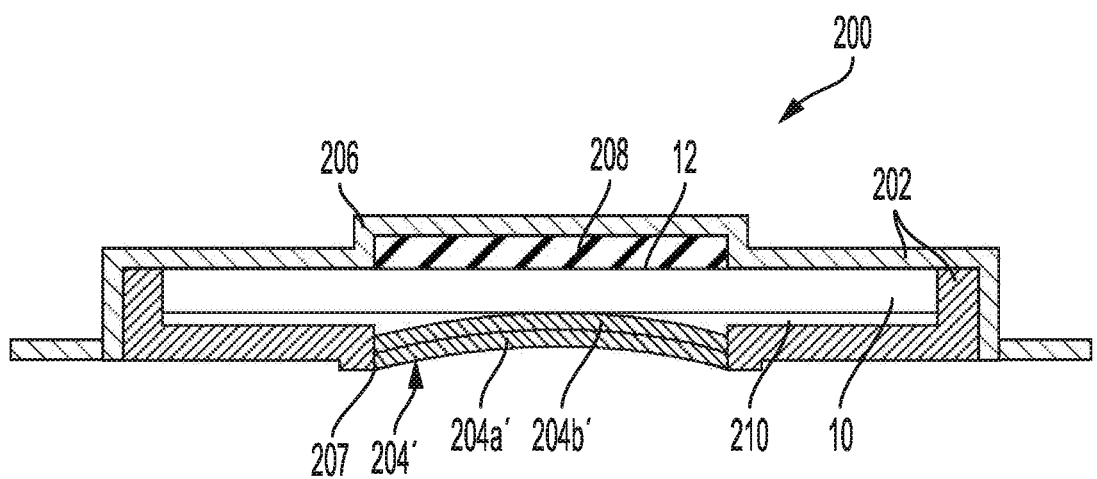
FIG. 2 is a cross section view of a socket depicting an assembly of the socket in a thermally expanded state according to an embodiment.

In this regard, FIG. 2 is a cross section view of socket 200 depicting assembly 204 in a thermally expanded state (as indicated in FIG. 2 as assembly 204') to push removable DSD 10 into contact with TIM 208. In the example of FIG. 2, assembly 204 is configured to push a first side of DSD 10 to cause a second side of DSD 10 opposite the first side to come into contact with TIM 208. Assembly 204 is attached to socket 200 at opposite ends of assembly 204 and is configured to expand due to heat generated by DSD 10 during operation. Housing 202 of socket 200 includes slot portion 207 through which assembly 204 is attached to socket 200.

As with socket 100 of FIGS. 1A to 1D, socket 200 in FIG. 2 can be part of an electronic device (e.g., a desktop, laptop, notebook computer, tablet, smartphone, network media player, portable media player, television, or digital camera) or may be a standalone device (e.g., a memory card reader). Housing 202 may be sized or configured to receive one or more form factors for a removable DSD, such as, for example, an SD card, microSD card, and/or nanoSD card. In addition, housing 202 may also be sized or configured to receive one or more different types of removable DSDs, such as, for example, an SD card, USB flash drive, SIM card, CF card, memory stick, and/or zip drive. In this regard, housing 202 may include different grooves or tracks for receiving different types of removable DSDs or different form factors.

In some implementations, housing 202 can be formed of one or more plastic materials or metal materials. In the example of FIG. 2, housing 202 is comprised of two components including a top portion and a bottom portion. The different components of housing 202 can include different materials affixed to each other. In other implementations, housing 202 can be formed of more components or integrally formed as a single component, as in the example of housing 302 in FIG. 3. As those of ordinary skill in the art will appreciate, the selection of materials or component arrangements for housing 202 can depend upon design considerations such as the strength, stiffness, electrical resistance, and/or ability to color the material.

In FIG. 2, assembly 204 is at a temperature that causes sufficient thermal expansion of assembly 204 further into slot portion 207 of housing 202 and into gap 210 between DSD 10 and housing 202, which can be created by the upward movement of DSD 10. In such a thermally expanded state of assembly 204, TIM 208 contacts DSD 10 and can increase a frictional resistance to removal of DSD 10. Assembly 204 can be inserted into slot portion 207 or otherwise attached to opposing walls of slot portion 207 so that when assembly 204 thermally expands, thermal expansion occurs in a direction toward DSD 10, as shown in FIG. 2. When not in a thermally expanded state, assembly 204 does not contact DSD 10 so as not to interfere with the insertion or removal of DSD 10 or cause DSD 10 to come into contact with TIM 208 located in slot portion 206 on the opposite side of housing 202.

In the example of FIG. 2, assembly 204 can include a bi-metal material composition with first layer 204a and second layer 204b, shown in thermally expanded states in FIG. 2 as layers 204a' and 204b'. First layer 204a can have a greater coefficient of thermal expansion than second layer 204b so that assembly 204 curves or bends upward toward DSD 10 through slot portion 207 during thermal expansion. Different materials can be used in the bi-metal configuration, such as brass and iron, brass and steel (e.g., stainless steel), or steel and copper, for example. While a bi-metal assembly is described above, those of ordinary skill in the art will appreciate that other materials with a similar thermal expansion property can be used as substitutes in other implementations. For example, materials that have a sufficient difference in coefficients of thermal expansion can be layered to provide a desired change in shape of the assembly when heated.

The curving or bending of assembly 204 causes at least a portion of assembly 204 to push onto DSD 10 and move DSD 10 into contact with TIM 208. In addition to removing or drawing heat from DSD 10, TIM 208 increases a frictional resistance to removal of DSD 10 when TIM 208 comes into contact with DSD 10. For its part, assembly 204 can also increase a frictional resistance to removal of DSD 10 when in the thermally expanded state contacting DSD 10. The increased resistance to removal provided by TIM 208 and assembly 204 can serve as a precautionary measure against removal of DSD 10 when assembly 204 is in the thermally expanded state. In this regard, assembly 204 may be viewed as a retaining strip that directly increases the frictional resistance to removal of DSD 10, and indirectly increases the frictional resistance to removal of DSD 10 via TIM 108.

TIM 208 includes a material, such as a thermally conductive pad including silicone, acrylic, or a metal TIM, that increases the thermal conductivity between DSD 10 on the one hand, and housing 202 on the other hand. TIM 208 and/or housing 202 can serve as heat sinks for DSD 10. In addition, the choice of material for TIM 208 can consider a coefficient of friction between the material and DSD 10 so that a material providing a higher coefficient of friction (e.g., a sticky silicone material) is used for TIM 208 to increase a resistance to removing DSD 10 when TIM 208 comes into contact with DSD 10.

Housing 202 or slot portion 206 may also include a thermally conductive material, such as graphite, copper, or aluminum. In some implementations, slot portion 206 may include fins for increasing an air surface thermal interface and/or for channeling air blown over slot portion 206 to remove heat from housing 202.

In some implementations, the location of TIM 208, slot portion 207, and assembly 204 relative to housing 202 when DSD 10 is fully received in housing 202 corresponds to at least one of a portion of DSD 10 with a higher thermal conductivity than other portions of DSD 10 and/or a portion of DSD 10 that generates more heat during operation than other portions of DSD 10. For example, portion 12 of DSD 10 can correspond to an area close to the location of a controller in DSD 10 that generates more heat than other portions of DSD 10. As another example, portion 12 of DSD 10 can correspond to an area that may have a relatively higher thermal conductivity, such as a graphite, graphene, copper, or aluminum plate or surface.

Those of ordinary skill in the art will appreciate that other arrangements of socket 200 are possible. For example, other implementations may include multiple assemblies that thermally expand to push respective TIMs into contact with DSD 10 to remove heat from DSD 10 or to increase a resistance to removal of DSD 10 from the housing.

Figure 3:
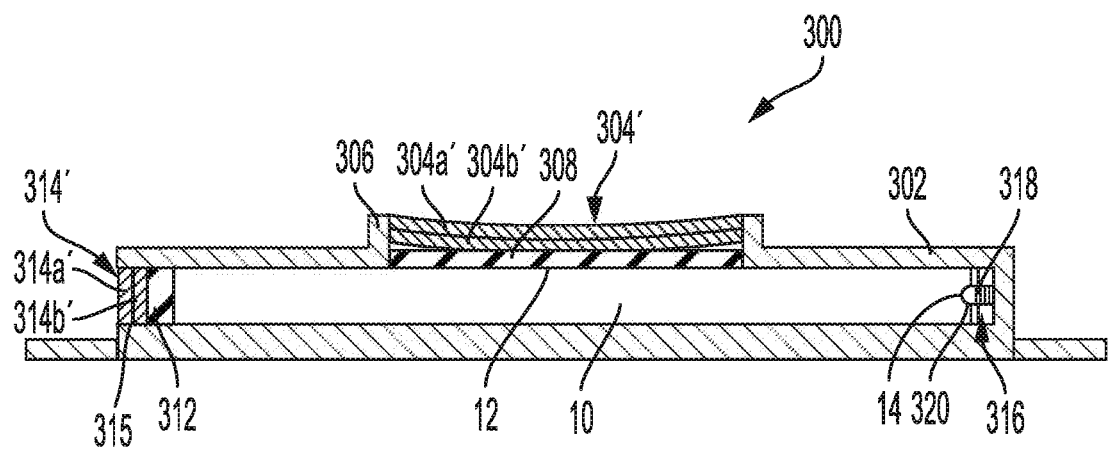
FIG. 3 is a cross section view of a socket including an intermediate device and two assemblies in thermally expanded states according to an embodiment.

In this regard, FIG. 3 is a cross section view of socket 300 including intermediate device 318 and assemblies 304' and 314' in thermally expanded states, as shown in FIG. 3. In more detail, assembly 304' is configured to push TIM 308 into contact with a top side of DSD 10, and assembly 314' is configured to push TIM 312 into contact with a lateral side of DSD 10, which in turn, pushes DSD 10 in a lateral direction. The lateral movement of DSD 10 into gap 316 between DSD 10 and housing 302 causes locking feature 14 of DSD 10 to engage with intermediate device 318, which further helps prevent removal of DSD 10 from housing 302 during operation of DSD 10.

Assembly 304' is attached to socket 300 at opposite ends of assembly 304' and is configured to expand due to heat generated by DSD 10 during operation. Housing 302 of socket 300 includes slot portion 306 through which assembly 304' is attached to socket 300. In FIG. 3, assembly 304' is at a temperature that causes sufficient thermal expansion of assembly 304' further into slot portion 306 of housing 302 to push TIM 308 into contact with DSD 10. In such a thermally expanded state of assembly 304', TIM 308 contacts DSD 10 to increase the frictional resistance to removal of DSD 10. Assembly 304' can be inserted into slot portion 306 or otherwise attached to opposing walls of slot portion 306 so that when assembly 304' thermally expands, thermal expansion occurs in a direction toward DSD 10, as shown in FIG. 3. When assembly 304' is not in a thermally expanded state, TIM 308 does not contact DSD 10 so as not to interfere with the insertion or removal of DSD 10.

Assembly 314' is attached to socket 300 at opposite ends of assembly 314' and is also configured to expand due to heat generated by DSD 10 during operation. Housing 302 of socket 300 includes slot portion 315 through which assembly 314' is attached to socket 300. In FIG. 3, assembly 314' is at a temperature that causes sufficient thermal expansion of assembly 314' further into slot portion 315 of housing 302 to push TIM 312 into contact with DSD 10. In such a thermally expanded state of assembly 314', TIM 312 contacts DSD 10 to increase the frictional resistance to removal of DSD 10. Assembly 314' can be inserted into slot portion 315 or otherwise attached to opposing walls of slot portion 315 so that when assembly 314' thermally expands, thermal expansion occurs in a direction toward DSD 10, as shown in FIG. 3. When assembly 314' is not in a thermally expanded state, TIM 312 does not contact DSD 10 so as not to interfere with the insertion or removal of DSD 10.

In addition, the lateral movement of DSD 10 caused by the thermal expansion of assembly 314' causes locking feature 14 of DSD 10 to engage intermediate device 318. In some implementations, locking feature 14 can include, for example, a notch in a side of DSD 10. Intermediate device 318 of socket 300 in the example of FIG. 3 is attached to an internal surface of housing 302 and the pressure of locking feature 14 of DSD 10 against intermediate device 318 locks or engages intermediate device 318 to increase a resistance to removal of DSD 10 from housing 302. In this regard, assembly 314' can be viewed as a retaining strip that locks intermediate device 318 through contact with TIM 312 and DSD 10. In some implementations, intermediate device 318 can include a latching portion and one or more springs to cause the latching portion to engage or lock into locking feature 14 of DSD 10.

In the example of FIG. 3, assembly 304' and assembly 314' may have different configurations so that assembly 314' protrudes farther toward DSD 10 before assembly 304' protrudes into housing 302 by the same distance. This can allow for a two-stage TIM contact with TIM 312 contacting and moving DSD 10 before TIM 308 contacts DSD 10 so that DSD 10 can move more easily laterally before TIM 308 comes into contact with DSD and increases a resistance to movement of DSD 10.

In one such example, assembly 314' is longer than assembly 304' along a length of housing 302, such that assembly 314' is more sensitive to heat and curves or bends before assembly 304' for the same amount of heat. In other examples, the layers of assembly 314' (i.e., layers 314a' and 314b') include respective materials with a greater difference in coefficients of thermal expansion than the layers of assembly 304' (i.e., layers 304a' and 304b') to provide for more bending or curvature of assembly 314' as compared to assembly 304'. While a bi-metal assembly is described above, those of ordinary skill in the art will appreciate that other materials with a similar thermal expansion property can be used as substitutes in other implementations. For example, materials that have a sufficient difference in coefficients of thermal expansion can be layered to provide a desired change in shape of the assembly when heated.

The curving or bending of assembly 304' causes at least a portion of TIM 308 to contact DSD 10. In addition to removing or drawing heat from DSD 10, TIM 308 increases a frictional resistance to removal of DSD 10 when TIM 308 comes into contact with DSD 10. TIM 308 can also increase a resistance to removal of DSD 10 when in contact with DSD 10. As discussed above, the increased resistance to removal can serve as a precautionary measure against removal of DSD 10 when assembly 304' is in the thermally expanded state. In this regard, assembly 304' may be viewed as a retaining strip to increase the frictional resistance to removal of DSD 10 via TIM 308.

TIM 308 and TIM 312 can include, for example, thermally conductive pads including silicone, acrylic, or metal TIMs, that increase the thermal conductivity between DSD 10 on the one hand, and housing 302 on the other hand. In some examples, TIM 308 and TIM 312 may comprise different materials to absorb different amounts of heat and/or provide different coefficients of friction. For example, TIM 308 may include a metal TIM to provide a lower coefficient of friction with DSD 10 than TIM 312 to allow for lateral movement of DSD 10 toward intermediate device 318.

TIM 308, TIM 312, and/or housing 302 may serve as heat sinks. For example, housing 302, slot portion 306, and slot portion 315 may include a thermally conductive material, such as graphite, copper, or aluminum. In some implementations, slot portion 306 and/or slot portion 315 may include fins or longer exposed walls extending from TIM 308 or TIM 312 for increasing an air surface thermal interface and/or for channeling air blown over slot portion 306 and/or slot portion 315 to remove heat from housing 302.

As with sockets 100 and 200 described above, socket 300 in FIG. 3 can be part of such an electronic device (e.g., a desktop, laptop, notebook computer, tablet, smartphone, network media player, portable media player, television, or digital camera) or may be a standalone device (e.g., a memory card reader). Housing 302 may be sized or configured to receive one or more form factors for a removable DSD, such as, for example, an SD card, microSD card, and/or nanoSD card. In addition, housing 302 may also be sized or configured to receive one or more different types of removable DSDs, such as, for example, an SD card, USB flash drive, SIM card, CF card, memory stick, and/or zip drive. In this regard, housing 302 may include different grooves or tracks for receiving different types of removable DSDs or different form factors.

Housing 302 can be formed of one or more plastic materials or metal materials. In the example of FIG. 3, housing 302 is integrally formed as a single component. As those of ordinary skill in the art will appreciate, the selection of materials and the number of components or portions for housing 302 can depend upon design considerations such as strength, stiffness, electrical resistance, and/or an ability to color the chosen material.

In some implementations, the location of TIM 308, TIM 312, slot portion 306, and/or slot portion 315 relative to housing 302 when DSD 10 is fully received in housing 302 corresponds to at least one of a portion of DSD 10 with a higher thermal conductivity than other portions of DSD 10 and/or a portion of DSD 10 that generates more heat during operation than other portions of DSD 10. For example, portion 12 of DSD 10 adjacent to TIM 308 can correspond to an area close to the location of a controller in DSD 10 that generates more heat than other portions of DSD 10. As another example, portion 12 of DSD 10 can correspond to an area that may have a relatively higher thermal conductivity, such as a graphite, graphene, copper, or aluminum plate or surface.

Those of ordinary skill in the art will appreciate that other arrangements of socket 300 are possible. For example, other implementations may include one or more assemblies that contact DSD 10 to push DSD 10 into contact with a TIM, as in the example of FIG. 2 discussed above.

Figure 4A:
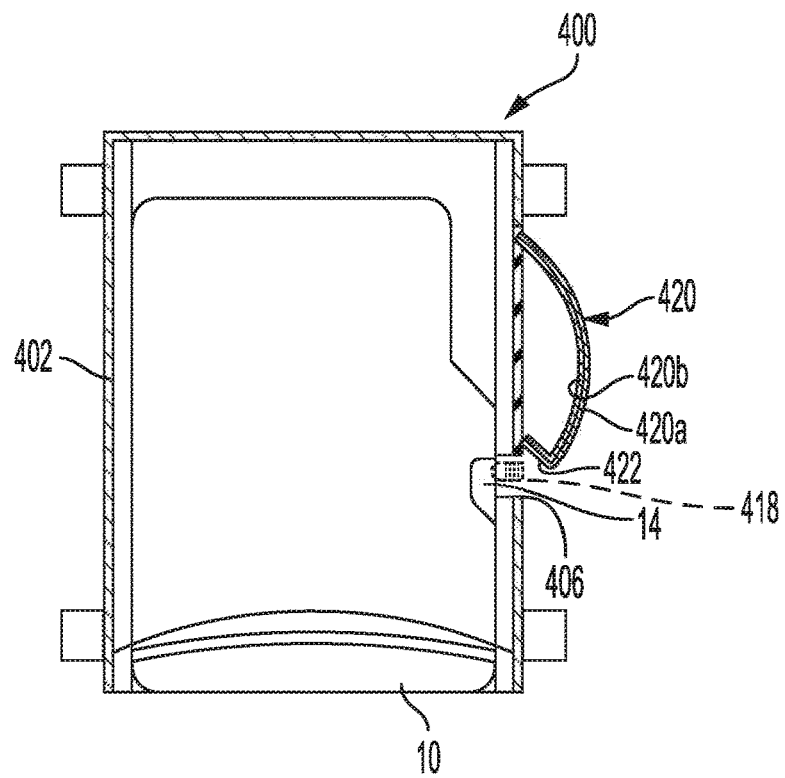
FIG. 4A is a top view of a socket including a retaining strip according to an embodiment.

FIG. 4A is a top view of socket 400 including retaining strip 420 in a thermally unexpanded state. As shown in FIG. 4A, socket 400 includes housing 402 and retaining strip or assembly 420 attached to housing 402. Retaining strip 420 is configured to expand due to heat generated by removable DSD 10 during operation to increase a resistance to removal of DSD 10 from housing 402. In more detail, retaining strip 420 is attached to an exterior side of housing 302 along a direction of insertion of DSD 10 into housing 402.

Figure 4B:
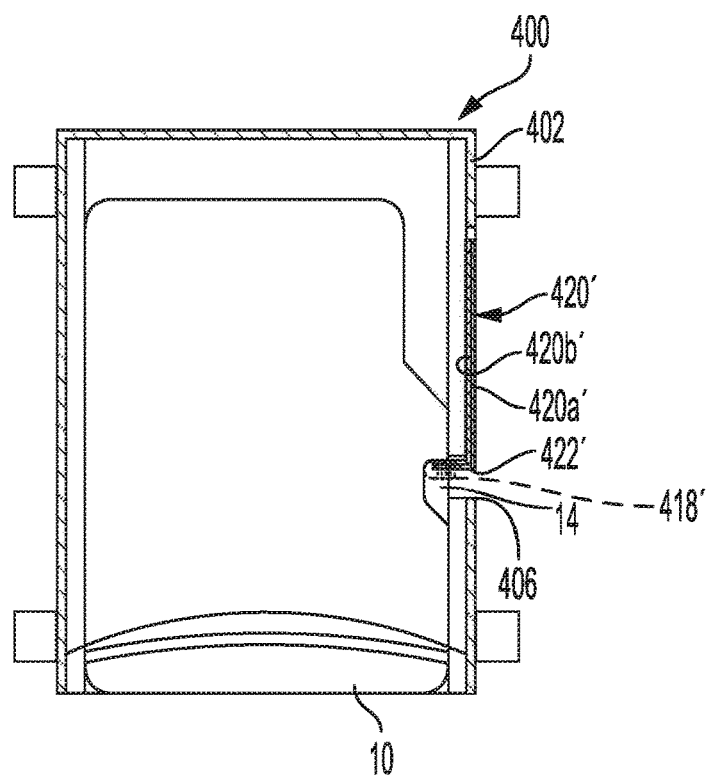
FIG. 4B is a top view of the socket of FIG. 4A depicting the retaining strip in a thermally expanded state according to an embodiment.

When sufficiently heated to the thermally expanded state shown in FIG. 4B (shown as retaining strip 420' in FIG. 4B), retaining strip 420 engages locking feature 14 of DSD 10. As shown in FIG. 4B, retaining strip 420 includes engagement portion 422, which engages or fits into locking feature 14 of DSD 10. Locking feature 14 of DSD 10 can include, for example, a notch in DSD 10. The engagement of engagement portion 422 into locking feature 14 ordinarily increases a resistance to removal of DSD 10 from housing 402. In addition, the absorption of heat by retaining strip 420 when in contact with DSD 10 can help remove heat from DSD 10 and transfer heat to housing 402.

In the example of FIGS. 4A and 4B, retaining strip 420 can include a bi-metal material composition with first layer 420a and second layer 420b. First layer 420a can have a lower coefficient of thermal expansion than second layer 420b so that assembly 420 straightens toward slot portion 406 during thermal expansion. Different materials can be used in the bi-metal configuration, such as brass and iron, brass and steel (e.g., stainless steel), or steel and copper, for example. While a bi-metal assembly is described above, those of ordinary skill in the art will appreciate that other materials with a similar thermal expansion property can be used as substitutes in other implementations. For example, materials that have a sufficient difference in coefficients of thermal expansion can be layered to provide a desired change in shape of the retaining strip when heated.

In the example of FIGS. 4A and 4B, engagement portion 422 is shown as a bent portion of retaining strip 420, however, other implementations may include a different shape or construction for engagement portion 422. For example, engagement portion 422 in other implementations may not include layers 420a and 420b, such that engagement portion 422 does not form part of a bi-metal composition. In such an implementation, engagement portion 422 may, for example, include a TIM to enhance the removal of heat from DSD 10 into assembly 420.

In some implementations, retaining strip 420 can lock an intermediate device, such as intermediate device 418 in FIGS. 4A and 4B, which is shown in dashed lines to indicate that the use of intermediate device 418 is optional. As shown in FIG. 4B retaining strip 420 can engage locking feature 14 of DSD 10 to increase a resistance to removal of DSD 10 from housing 402. For example, intermediate device 418 can include a latching portion and one or more springs to cause the latching portion to engage or lock into locking feature 14 of DSD 10 when pushed by engagement portion 422 when retaining strip 420 is in its thermally expanded state.

As discussed above, the foregoing example arrangements of sockets provide assemblies that in a thermally expanded state provide a resistance to premature removal of a DSD and/or draw heat from the DSD, such as by causing a TIM to come into contact with the removable DSD. Such assemblies or retaining strips can ordinarily allow for a greater amount of power to be safely used by the DSD in terms of preventing damage to the DSD or data loss, preventing errors caused by the DSD being removed too soon, and preventing users from touching too much of the DSD when it is hot.

Other Embodiments

The foregoing description of the disclosed example sockets is provided to enable any person of ordinary skill in the art to make or use the embodiments in the present disclosure. Various modifications to these examples will be readily apparent to those of ordinary skill in the art, and the principles disclosed herein may be applied to other examples without departing from the scope of the present disclosure. The described embodiments are to be considered in all respects only as illustrative and not restrictive. All changes which come within the meaning and range of equivalency of the claims are to be embraced within their scope.

What is claimed is:

1. A socket, comprising:
   a housing configured to receive a removable Data Storage Device (DSD);
   a Thermal Interface Material (TIM); and
   an assembly attached to the housing and configured to expand due to heat, wherein the assembly in a thermally expanded state causes the TIM to come into contact with the removable DSD to draw heat away from the removable DSD.

2. The socket of claim 1, wherein the assembly is further configured to push the TIM to come into contact with the removable DSD.

3. The socket of claim 1, wherein the assembly is further configured to push a first side of the removable DSD to cause a second side of the removable DSD opposite the first side to come into contact with the TIM.

4. The socket of claim 1, wherein the housing includes a slot portion through which the assembly is attached to the socket.

5. The socket of claim 1, wherein the assembly includes a bi-metal material composition.

6. The socket of claim 1, wherein the removable DSD is a Secure Digital (SD) memory card.

7. The socket of claim 1, wherein the location of the TIM relative to the housing when the removable DSD is fully received in the housing corresponds to at least one of a portion of the removable DSD with a higher thermal conductivity than other portions of the removable DSD and a portion of the removable DSD that generates more heat during operation than other portions of the removable DSD.

8. The socket of claim 1, further comprising an additional TIM configured to come into contact with the removable DSD to draw heat away from the removable DSD.

9. The socket of claim 1, wherein the TIM increases a resistance to removal of the removable DSD when the TIM comes into contact with the removable DSD.

10. The socket of claim 1, further comprising a retaining strip attached to the housing such that the retaining strip expands due to the heat generated by the removable DSD during operation of the removable DSD to increase a resistance to removal of the removable DSD from the housing when the retaining strip is in a thermally expanded state.

11. A socket, comprising:
    a housing configured to receive a removable Data Storage Device (DSD); and
    a retaining strip attached to the housing in a configuration such that the retaining strip expands due to heat to increase a resistance to removal of the removable DSD from the housing when the retaining strip is in a thermally expanded state, wherein the retaining strip does not contact the removable DSD when the retaining strip is not in the thermally expanded state and the removable DSD is fully received in the housing.

12. The socket of claim 11, wherein the retaining strip engages with a locking feature of the removable DSD when the retaining strip is in the thermally expanded state.

13. The socket of claim 12, wherein the retaining strip includes a bent engagement portion that engages the locking feature when the retaining strip is in the thermally expanded state.

14. The socket of claim 11, wherein the retaining strip is attached to a side of the housing along a direction of insertion of the removable DSD into the housing.

15. The socket of claim 11, wherein the retaining strip includes a bi-metal material composition.

16. The socket of claim 11, wherein the removable DSD is a Secure Digital (SD) memory card.

17. The socket of claim 11, further comprising an intermediate device attached to the housing and configured to engage a locking feature of the removable DSD, and wherein the retaining strip locks the intermediate device to increase a resistance to removal of the removable DSD from the housing when the retaining strip is in the thermally expanded state.

18. The socket of claim 11, further comprising a Thermal Interface Material (TIM), wherein the retaining strip in the thermally expanded state causes the TIM to come into contact with the removable DSD.

19. A socket, comprising:
a housing configured to receive a removable Data Storage Device (DSD); and
an assembly attached to the housing and configured to expand due to heat, wherein the assembly in a thermally expanded state increases a resistance to removal of the removable DSD from the housing, wherein the assembly does not contact the removable DSD when the assembly is not in the thermally expanded state and the removable DSD is fully received in the housing.

20. The socket of claim 19, wherein the assembly in the thermally expanded state causes a portion of the socket to come into contact with the removable DSD to increase the resistance to removal of the removable DSD from the housing.

21. A socket, comprising:
a housing configured to receive a removable Data Storage Device (DSD);
an assembly attached to the housing and configured to expand due to heat; and
an intermediate device attached to the housing and configured to engage a locking feature of the removable DSD, wherein the assembly locks the intermediate device to increase a resistance to removal of the removable DSD from the housing when the retaining strip is in a thermally expanded state.

22. A socket, comprising:
a housing configured to receive a removable Data Storage Device (DSD);
a retaining strip attached to the housing in a configuration such that the retaining strip expands due to heat to increase a resistance to removal of the removable DSD from the housing when the retaining strip is in a thermally expanded state; and
a Thermal Interface Material (TIM), wherein the retaining strip in the thermally expanded state causes the TIM to come into contact with the removable DSD.

* * * * *